(12) United States Patent
Pallotta

(10) Patent No.: US 9,948,253 B2
(45) Date of Patent: Apr. 17, 2018

(54) PUSH-PULL AMPLIFIER, CORRESPONDING APPARATUS AND METHOD

(71) Applicant: STMicroelectronics S.r.l., Agrate Brianza (IT)

(72) Inventor: Andrea Pallotta, Rho (IT)

(73) Assignee: STMicroelectronics S.r.l., Agrate Brianza (IT)

(*) Notice: Subject to any disclaimer, the term of this patent is extended or adjusted under 35 U.S.C. 154(b) by 30 days.

(21) Appl. No.: 15/158,006

(22) Filed: May 18, 2016

(65) Prior Publication Data
US 2017/0117858 A1 Apr. 27, 2017

(30) Foreign Application Priority Data
Oct. 23, 2015 (IT) .................. 102015000065025

(51) Int. Cl.
| | |
|---|---|
| H03F 3/26 | (2006.01) |
| H03F 1/02 | (2006.01) |
| H03F 3/195 | (2006.01) |
| H03F 3/213 | (2006.01) |
| H03F 1/34 | (2006.01) |
| H03F 1/30 | (2006.01) |
| H03F 3/30 | (2006.01) |

(52) U.S. Cl.
CPC .............. *H03F 3/26* (2013.01); *H03F 1/0205* (2013.01); *H03F 3/195* (2013.01); *H03F 3/213* (2013.01); *H03F 1/307* (2013.01); *H03F 1/347* (2013.01); *H03F 3/3066* (2013.01); *H03F 3/3071* (2013.01); *H03F 2200/451* (2013.01); *H03F 2200/537* (2013.01)

(58) Field of Classification Search
CPC .......... H03F 3/26; H03F 1/0205; H03F 3/195; H03F 3/213; H03F 1/307; H03F 3/3066; H03F 3/3071; H03F 3/3076; H03F 1/347; H03F 2200/534; H03F 2200/541
USPC .......................................... 330/262, 263, 276
See application file for complete search history.

(56) References Cited

U.S. PATENT DOCUMENTS 3,652,947 A * 3/1972 Hollingsworth .......... H03F 3/26
330/276
3,652,948 A * 3/1972 Fierstien ................... H03F 3/26
330/276

(Continued)

OTHER PUBLICATIONS

IT Search Report and Written Opinion for IT 102015000065025 dated Jun. 30, 2016 (10 pages).

(Continued)

*Primary Examiner* — Khanh V Nguyen
(74) *Attorney, Agent, or Firm* — Gardere Wynne Sewell LLP

(57) ABSTRACT

A push-pull amplifier includes a pair of active devices driving the primary side of a double distributed active transformer (DDAT). The primary side of the DDAT includes a cascaded arrangement of primary windings of a first set of transformers with the active devices coupled ends of cascaded arrangement of primary windings. The secondary side of the DDAT includes a cascaded arrangement of secondary windings of a second set of transformers coupled to a load. Secondary windings of the first set of transformers drive inputs of respective active stages. Outputs of the active stages drive respective primary windings of the second set of transformers.

11 Claims, 4 Drawing Sheets

(56) References Cited

U.S. PATENT DOCUMENTS

| | | | | |
|---|---|---|---|---|
| 3,699,465 A | * | 10/1972 | Pranke | H03F 3/26 330/276 |
| 3,875,332 A | * | 4/1975 | Fletcher | H04L 25/4904 370/296 |
| 7,509,111 B2 | * | 3/2009 | Langenberg | H03D 7/1441 455/326 |
| 8,665,019 B2 | * | 3/2014 | Wang | H03F 1/0272 330/253 |
| 2010/0164628 A1 | | 7/2010 | Pallotta | |

OTHER PUBLICATIONS

Farahabadi Payam M et al: "Compact High-Power 60 GHz Power Amplifier in 65 nm CMOS," Proceedings of the IEEE 2013 Custom Integrated Circuits Conference, IEEE, Sep. 22, 2013, pp. 1-4.

Yeh Jin-Fu et al: "A 60-GHz Power Amplifier Design Using Dual-Radial Symmetric Architecture in 90-nm Low-Power CMOS," IEEE Transactions on Microwave Theory and Techniques, IEEE Service Center, Piscataway, NJ, US, vol. 61, No. 3, Mar. 7, 2013, pp. 1280-1290.

Tuffery, A et al: "CMOS Fully Integrated Reconfigurable Power Amplifier with Efficiency Enhancement for LTE Applications," Electronics Letters, IEE Stevenage, GB, vol. 51, No. 2, Jan. 22, 2015, pp. 181-183.

Jen, Yung-Nien et al: "Design and Analysis of a 55-71-GHz Compact and Broadband Distributed Active Transformer Power Amplifier in 90-nm CMOS Process," IEEE Transactions on Microwave Theory and Techniques, IEEE Service Cetner, Piscataway, NJ, US, vol. 57, No. 7, Jul. 9, 2009, pp. 1637-1646.

Pallotta, Andrea, et al: "Millimeter-Wave 14dBm CMOS Power Amplifier with Input-Output Distributed Transformers," CICC2010 (Custom Integrated Circuit Conference), San Jose, CA, Sep. 19-22, 2010, pp. 1-4.

* cited by examiner

US 9,948,253 B2

PUSH-PULL AMPLIFIER, CORRESPONDING APPARATUS AND METHOD

PRIORITY CLAIM

This application claims priority from Italian Application for Patent No. 102015000065025 filed Oct. 23, 2015, the disclosure of which is incorporated by reference.

TECHNICAL FIELD

The description relates to push-pull amplifiers.

One or more embodiments may find use in a variety of applications such as e.g. radio frequency (RF) power amplifiers (PAs). Power amplifiers, possibly up to millimeter wave, used in the RF PA market, such a CMOS based RF power amplifiers for mobile terminals, may be exemplary of such applications.

BACKGROUND

A push-pull output circuit is an electronic circuit which includes a pair of active devices such as vacuum tubes, transistors (bipolar, FET) that alternately supply current to, or absorb current from, a connected load.

Push-pull circuits may be included in various types of digital devices and various types of amplifiers. They may include a complementary pair of active devices in an arrangement wherein, for instance, one device sinks current from the load to ground or a negative power supply, and the other device supplies current to the load from a positive power supply.

The output power that can be achieved with a push-pull arrangement is higher than the continuous dissipation rating of either active device and increases the power output for a certain supply voltage. Push-pull amplifiers are also known to reduce distortion (due to cancellation of harmonics of even order).

Push-pull circuits have been used from the early days of electronics, e.g. due to their capability of allowing the use of a loudspeaker in the place of headphones, and continue to be used today e.g. in audio, radio frequency, digital and power electronics systems.

A continuing demand thus exists for improved push-pull circuits.

SUMMARY

According to one or more embodiments, a push-pull circuit is provided.

One or more embodiments may also relate to corresponding apparatus (e.g. a power amplifier, such as the RF power amplifier for a mobile terminal) as well as to a corresponding method.

In one or more embodiments, a double distributed active transformer (DDAT) may replace a single transformer so that the DDAT may be coupled to the push-pull input pair of active devices.

One or more embodiments may provide e.g. amplifiers adapted for use in the E-band (81-86 GHz), possibly integrated with BiCMOS technology.

One or more embodiments may provide one or more of the following advantages: output power can be increased by a factor of N in comparison with a conventional arrangement, where N is the number of transformer elements, while the maximum output voltage on each active element (e.g. transistor) can be divided by a factor of N, reducing breakdown stress, thus providing a power amplifier structure with lower breakdown; in a push-pull arrangement, a double distributed active transformer (DDAT) lends itself to an input current signal in the place of an input voltage signal; biasing of the push-pull pair may be facilitated, especially in millimeter-wave applications; ultra-high frequency RF power amplifier design may be facilitated, e.g. due to the possibility of simplifying RF power amplifier and preamplifier circuits by resorting to an architecture which is compact and easy to integrate and/or due to the possibility of simplifying scaling of the RF power amplifier design up to millimeter-wave frequencies; silicon-based technologies may fully exploit the advantages of DDAT arrangements in terms of transistor breakdown issue mitigation, with the capability of increasing the delivered output power.

BRIEF DESCRIPTION OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
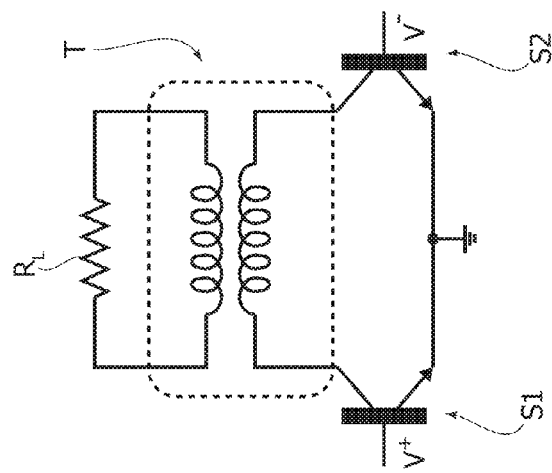
FIG. 1 depicts the basic layout of a push-pull circuit.

FIG. 1 is an exemplary representation of a conventional push-pull circuit including a pair of active devices S1, S2. While bipolar transistors are illustrated here as exemplary of such active devices, other active devices (e.g. FETs or even vacuum tubes) may be employed.

Operation of such a push-pull circuit may involve alternate operation of the active devices S1, S2 to supply current to, or absorb current from, the primary winding of a transformer T whose secondary winding feeds a load $R_L$. Such a load may be e.g. a resistive load, a reactive load or a resistive/reactive load.

As exemplified herein, the primary winding of the transformer T may include an intermediate "tap" point set to a voltage power supply for proper transistor collector biasing (VCC).

As discussed previously, a wide variety of implementations of push-pull circuits have been used from the early days of electronics, thus making it unnecessary to provide a more detailed description of the basic principles of operation and structure of such circuits.

In such implementations, the output power may be limited to the output power delivered by the active devices S1, S2. Also, when the transformer turn ratio is close to unity and/or in case of load impedance mismatching, voltage breakdown stress may be applied to transistors used as active devices.

In one or more embodiments, the elementary primary-secondary structure of the transformer T may be replaced by a double distributed active transformer (DDAT) including two sets of transformers T11, T12 and T21, T22 having a corresponding set of active stages (e.g. differential amplifier stages) DA1, DA2 therebetween.

Figure 2:
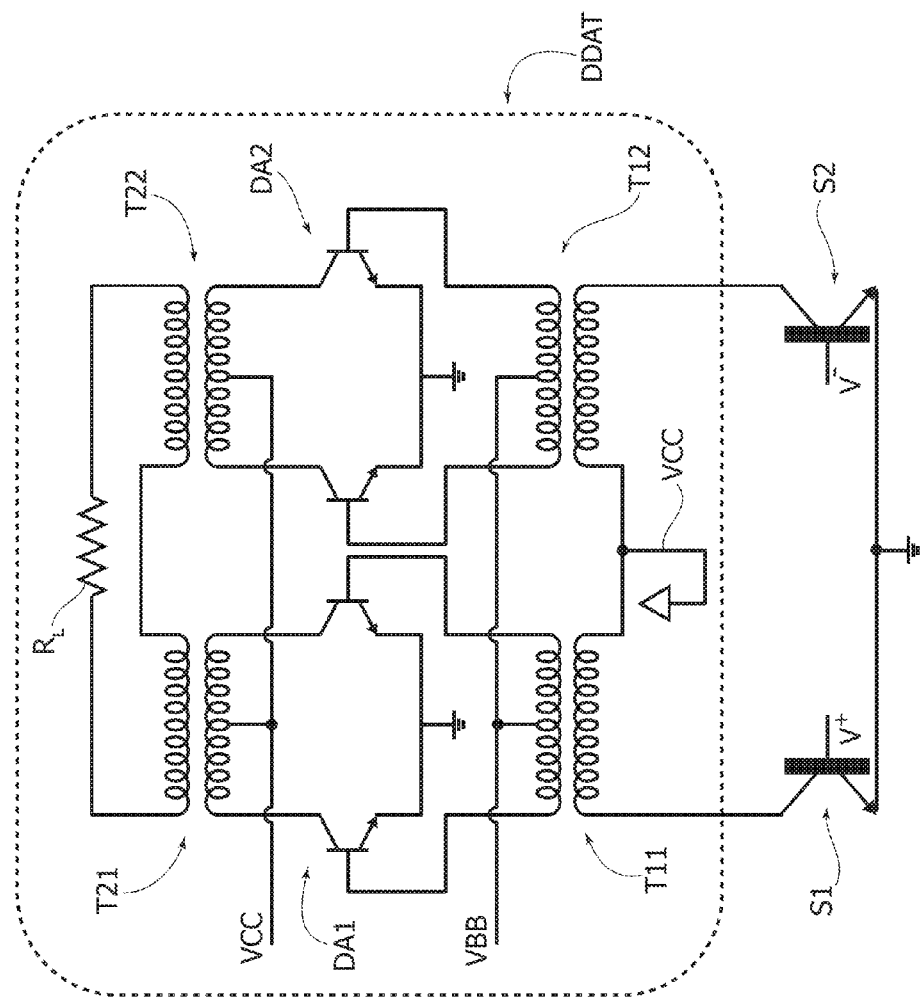
FIG. 2 is a circuit diagram.

In one or more embodiments as exemplified in FIG. 2, the primary side of such a double distributed active transformer may include the cascaded (e.g. series-coupled) arrangement of the primary windings of two transformers T11, T12, optionally with an intermediate tap point therebetween set to a voltage power supply for proper transistor collector biasing (VCC). The push-pull input pair of the active devices S1 and S2 may thus drive an input current into these primary windings.

In one or more embodiments as exemplified in FIG. 2, the secondary windings of the two transformers T11, T12 may drive the inputs (e.g. the differential inputs) of two active stages DA1, DA2, which in turn may (independently) drive the primary windings of the two transformers T21, T22.

In one or more embodiments as exemplified in FIG. 2, the secondary windings of the two transformers T21, T22 may be cascaded (e.g. series-coupled) to each other to drive the load $R_L$. The load $R_L$ may thus be traversed by the current flowing though the secondary windings of the two transformers T21, T22.

FIG. 2 is exemplary of a basic layout of a double distributed active transformer wherein the primary winding and the secondary winding of the elementary structure of FIG. 1 are each "split" (that is, distributed) into two, with two input transformers T11, T12 each driving a respective output transformer T21, T22 via a respective active (amplifier) stage DA1, DA2.

In the diagram of FIG. 2, VCC and VBB denote respective voltage power supplies coupled with intermediate points of the primary windings of T21, T22 and of the secondary windings of T11, T12.

Figure 3:
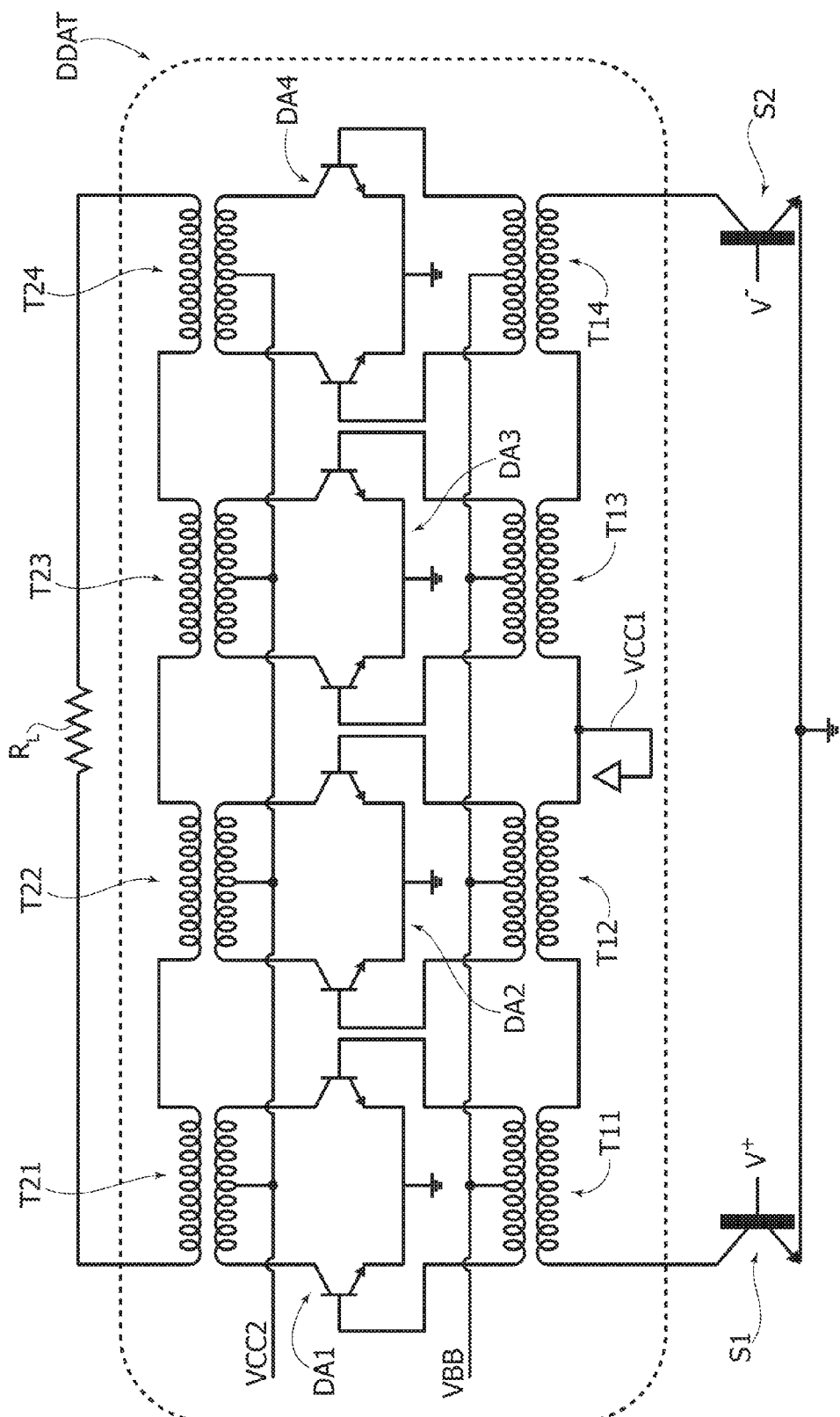
FIG. 3 is a circuit diagram.

FIG. 3 is exemplary of the possibility of expanding the "twofold" double distributed active transformer of FIG. 2 to e.g. a "fourfold" DDAT, wherein the primary winding and the secondary windings of the elementary structure of FIG. 1 are each split (that is, distributed) into four, with four input transformers T11, T12, T13, T14 each driving a respective output transformer T21, T22, T23, T24 via a respective active (amplifier) stage DA1, DA2, DA3, DA4.

In one or more embodiments as exemplified in FIG. 3, the primary side of the double distributed active transformer may include the cascaded (e.g. series-coupled) arrangement of the primary windings of four transformers T11, T12, T13, T14, optionally with an intermediate tap point between the primary windings of T12 and T13 set to a voltage power supply for proper transistor collector biasing (VCC1). The push-pull input pair of the active devices S1 and S2 may thus drive an input current into the primary windings of T11, T12, T13, T14.

In one or more embodiments as exemplified in FIG. 3, the secondary windings of the transformers T21, T22, T23, T24 may be cascaded (e.g. series-coupled) to drive the load $R_L$. The load $R_L$ may thus be traversed by the current flowing though the secondary windings of the transformers T21, T22, T23, T24.

In the diagram of FIG. 3, VCC2 and VBB denote respective voltage power supplies coupled with intermediate points of the primary windings of T21, T22, T23, T24 and of the secondary windings of T11, T12, T13, T14.

Further details of the possible implementations of the double distributed active transformer layout of FIG. 3 may be gathered e.g. from A. Pallotta et al.: "Millimeter-Wave 14 dBm CMOS Power Amplifier with Input-Output Distributed transformers", CICC2010 (Custom Integrated Circuit Conference), San Jose, Calif., 19-22 Sep. 2010, pp. 1-4 (incorporated by reference).

In one or more embodiments, the resulting power combination may lead to increasing the output power of the push-pull power amplifier by a factor of N, where N is the number of transformer elements resulting from splitting/distributing the primary and secondary windings of the basic layout of FIG. 1 (e.g. N=2 in FIG. 2, N=4 in FIG. 3).

Likewise, the maximum output voltage on each active device (e.g. transistor) may be divided by a factor of N, with breakdown stress primarily involving the transistors of the pairs DA1, DA2, with however the collector voltage reduced by N.

In one or more embodiments as exemplified herein, the active devices S1, S2 (e.g. the collector/drain terminals of bipolar transistors/FETs) may be directly coupled to the double distributed active transformer (DDAT) input.

Figure 4:
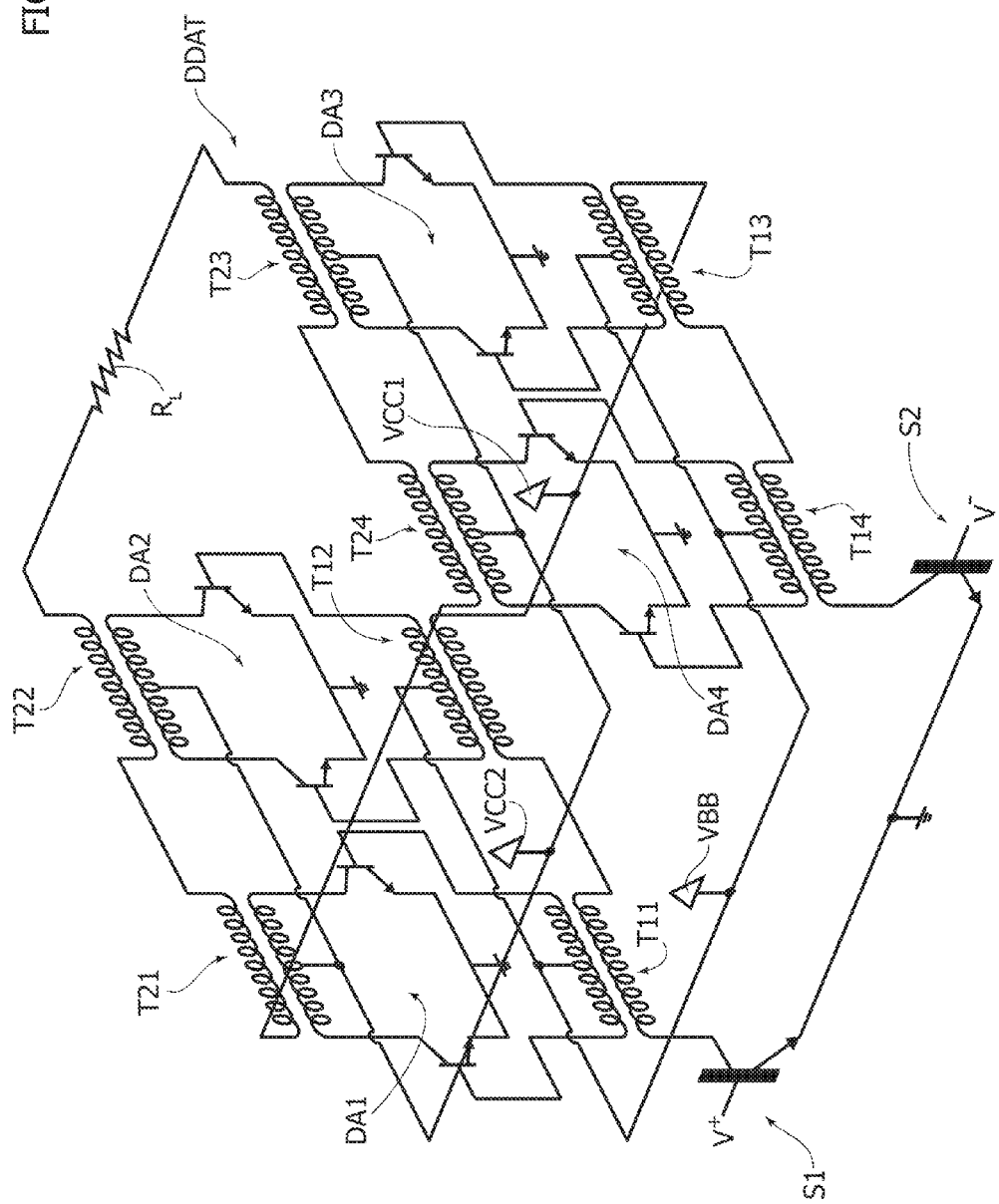
FIG. 4 is exemplary of folding a circuit as exemplified in FIG. 3.

In one or more embodiments, a DDAT structure (both distributed by two, as shown in FIG. 2, or distributed by four as shown in FIG. 3 or possibly exhibiting a higher degree of splitting/distributing) may be folded in space as exemplified in FIG. 4 in order to get a more compact device.

Figure 5:
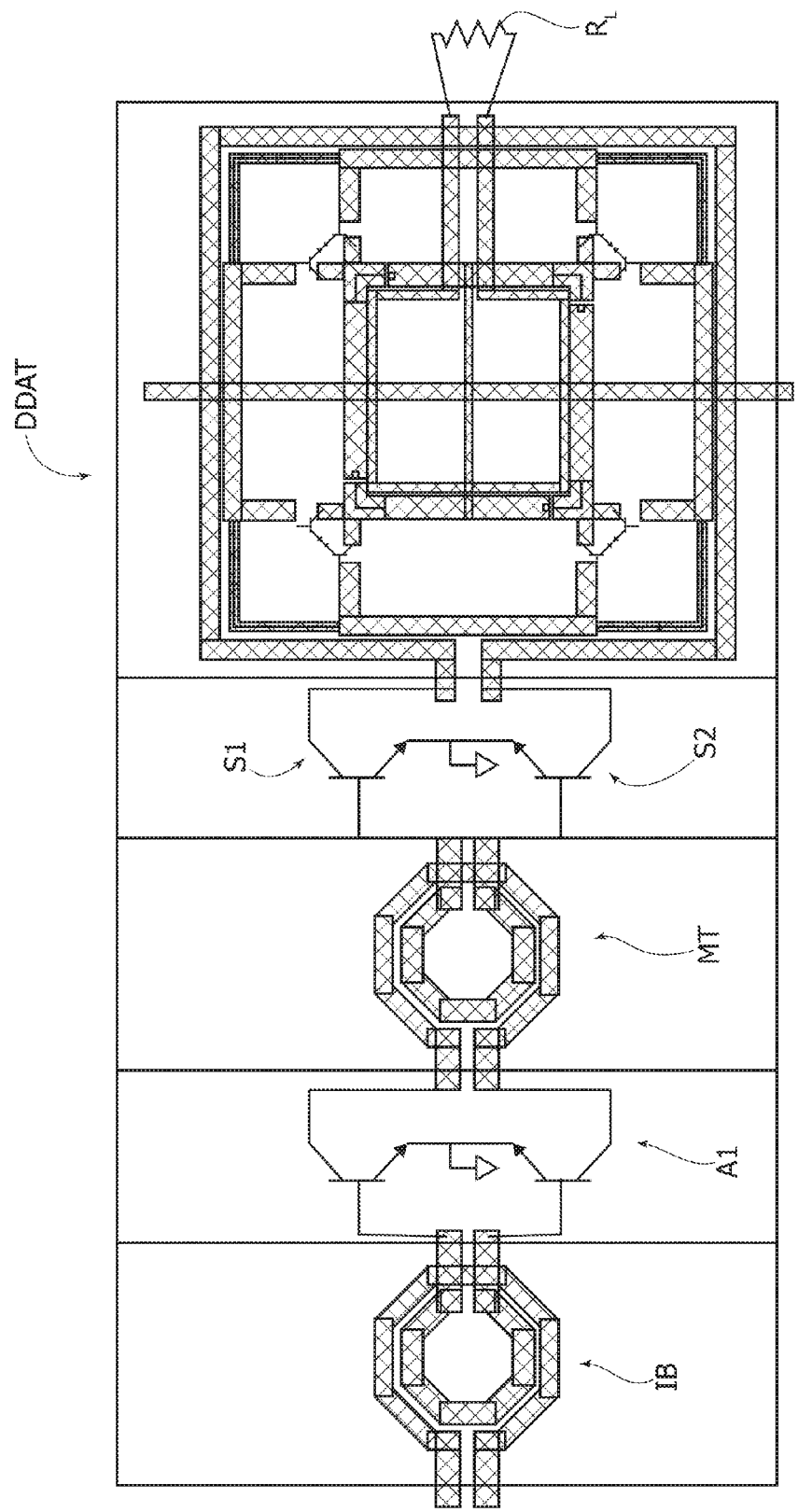
FIG. 5 is a schematic diagram of a multi-stage arrangement in integrated form.

In one or more embodiments, a push-pull DDAT structure as exemplified herein may be included in a multi-stage, compact device as exemplified in FIG. 5, including, e.g.: an input stage (e.g. a balun transformer) IB, a first (pre) amplifier stage A1 to amplify the signal from the input stage, an inter-stage matching transformer MT fed with the output from the amplifier stage A1, and the cascaded arrangement of a push-pull pair S1, S2 coupled to the amplifier stage A1 via the transformer MT and a DDAT according to any of the embodiments exemplified herein in order to drive a load $R_L$.

A possible integrated implementation of a DDAT as exemplified in FIG. 5 is described in United States Patent Application Publication No. 2010/0164628 A1 (incorporated by reference).

While the depiction of FIG. 5 refers to a possible integrated circuit (IC) implementation, such a multi-stage, compact device lends itself to being produced in a non-IC implementation (e.g. discrete components).

It will be noted that one or more embodiments may not include the load $R_L$ as part of the embodiments.

While one or more embodiments as exemplified herein may be semiconductor technology independent, the reduced transistor breakdown issue makes it possible to implement one or more embodiments by resorting to cost-competitive silicon-based processes, such as CMOS and BiCMOS, leading to arrangements which may be fully and easily scalable in frequency up to the millimeter wave domain.

In one or more embodiments, the availability of a center tap at the DDAT input as exemplified herein may facilitate push-pull transistor drain/collector biasing.

One or more embodiments may thus provide a push-pull amplifier including a pair of active devices (e.g. transistors S1, S2) driving the primary side of a transformer arrangement having a secondary side coupleable to a load (e.g. $R_L$), wherein the transformer arrangement includes a double distributed active transformer (DDAT) including a first set of transformers (e.g. T11, T12 in FIG. 2 or T11, T12, T13, T14 in FIG. 3) and a second set (e.g. T21, T22 in FIG. 2 or T21, T22, T23, T24 in FIG. 3) transformers having a set of active stages (e.g. DA1, DA2 in FIG. 3 or DA1, DA2, DA3, DA4 in FIG. 3) therebetween, wherein:

the primary side of the double distributed active transformer includes a cascaded arrangement of the primary windings of the transformers in the first set of transformers with the pair of active devices coupled to said primary windings of the transformers in the first set of transformers to cause a input current to the transformer to flow therethrough, the secondary side of the double distributed active transformer includes a cascaded arrangement of the secondary windings of the transformers in the second set of transformers to produce a load current to flow through the secondary windings of the transformers in the second set of transformers, the secondary windings of the transformers in the first set of transformers drive respective active stages in the set of active stages, said active stages in the set of active stages driving the primary windings of respective ones of the transformers in the second set of transformers.

One or more embodiments may include a tap point intermediate the primary windings of the transformers in the first set of transformers set to a voltage power supply line (e.g. VCC, VCC1) for proper transistor collector biasing.

In one or more embodiments, the first set of transformers may includes an array of an even number (e.g. two, four, or generally 2N) of transformers with said tap point set to a voltage supply line centrally of the array, whereby the tap point partitions said array into two sub-sets each including a same number of transformers (e.g. one, two or generally N) in the first set of transformers.

In one or more embodiments, the active devices in said pair of active devices may include current sink terminals (e.g. collector/drain) directly coupled to the primary windings of the transformers in the first set of transformers.

In one or more embodiments, the double distributed active transformer (DDAT) may be folded in space to a three-dimensional, e.g. channel-like structure (see e.g. FIG. 4).

In one or more embodiments, the double distributed active transformer (DDAT) may be implemented as an integrated circuit.

In one or more embodiments, the active stages in said set of active stages may include differential amplifiers amplifying the signals input thereto at the secondary windings of the transformers in the first set of transformers.

In one or more embodiments, an amplifier apparatus may include a push-pull amplifier of any of the embodiments exemplified herein.

In one or more embodiments, such an amplifier apparatus may include:
an input stage (e.g. IB),
a first amplifier stage (e.g. A1) to amplify the signal from the input stage),
a matching transformer stage (e.g. MT) fed with the output from the amplifier stage, and
a push-pull amplifier of any of the embodiments exemplified herein, coupled to said first amplifier stage via said matching transformer stage.

Without prejudice to the underlying principles, the details and embodiments may vary, even significantly, with respect to what has been described by way of example only without departing from the extent of protection.

The extent of protection is defined by the annexed claims.

The invention claimed is:

1. A push-pull amplifier, comprising:
a pair of active devices driving a primary side of a transformer arrangement having a secondary side configured to be coupled to a load,
wherein the transformer arrangement includes:
a double distributed active transformer including a first set of transformers and a second set transformers; and
a set of active stages coupled between the first and second sets of transformers,
wherein:
the primary side includes a cascaded arrangement of primary windings of the first set of transformers with the pair of active devices directly connected to ends of the cascaded arrangement of primary windings of the first set of transformers, the pair of active devices configured to cause a transformer input current to flow from the cascaded arrangement of primary windings of the first set of transformers through the pair of active devices,
the secondary side includes a cascaded arrangement of secondary windings of the second set of transformers configured to produce a load current, and
secondary windings of the first set of transformers are coupled to drive inputs of respective active stages of the set of active stages, said active stages of the set of active stages having outputs driving respecting primary windings of the second set of transformers.

2. The push-pull amplifier of claim 1, further comprising a tap point that is intermediate of the cascaded arrangement of primary windings of the first set of transformers and configured to be coupled to a voltage power supply line.

3. The push-pull amplifier of claim 2, wherein the first set of transformers includes an array of an even number of transformers with said tap point positioned centrally of the array, wherein the tap point partitions said array into two sub-sets each including a same number of transformers in the first set of transformers.

4. The push-pull amplifier of claim 1, wherein the active devices in said pair of active devices include current sink terminals directly coupled respectively at said ends of the cascaded arrangement of primary windings.

5. The push-pull amplifier of claim 1, wherein the double distributed active transformer is folded in space to a three-dimensional structure.

6. The push-pull amplifier of claim 1, wherein the double distributed active transformer is implemented as an integrated circuit.

7. The push-pull amplifier of claim 1, wherein active stages in said set of active stages include differential amplifiers amplifying signals input thereto from the secondary windings of the first set of transformers.

8. An amplifier, comprising:
an input stage,
a first amplifier stage configured to amplify a signal from the input stage,
a matching transformer stage fed with an output from the first amplifier stage,
a push-pull amplifier having an input coupled to an output of the matching transformer, wherein said push-pull amplifier comprises:

a pair of active devices driving a primary side of a transformer arrangement having a secondary side configured to be coupled to a load, wherein the transformer arrangement includes:

a double distributed active transformer including a first set of transformers and a second set transformers; and a set of active stages coupled between the first and second sets of transformers, wherein:

the primary side includes a cascaded arrangement of primary windings of the first set of transformers with the pair of active devices directly connected to ends of the cascaded arrangement of primary windings of the first set of transformers, the pair of active devices configured to cause a transformer input current to flow from the cascaded arrangement of primary windings of the first set of transformers through the pair of active devices, the secondary side includes a cascaded arrangement of secondary windings of the second set of transformers configured to produce a load current, and secondary windings of the first set of transformers are coupled to drive inputs of respective active stages of the set of active stages, said active stages of the set of active stages having outputs driving respecting primary windings of the second set of transformers.

9. An amplifier circuit, comprising:

a push-pull circuit including a first transistor having a first conduction path coupled between a first node and a ground node and a second transistor having a second conduction path coupled between a second node and the ground node, wherein control terminals of the first and second transistors are configured to receive an input; and a double distributed active transformer (DDAT) including:

a first set of transformers including first primary windings coupled in series with each other and directly connected at a first end to the first node and directly connected at a second end to a power supply node and second primary windings coupled in series with each other and directly connected at a third end to the power supply node and directly connected at a fourth end to the second node, the first set of transformers further including a plurality of secondary windings;

a second set of transformers including a plurality of secondary windings coupled in series between a first output node and a second output node, the second set of transformers further including a plurality of primary windings; and a plurality of differential active stages, each active stage having inputs coupled to ends of one of the secondary windings of the first set of transformers and outputs coupled to ends of one of the primary windings of the second set of transformers.

10. The amplifier circuit of claim 9, wherein the double distributed active transformer is folded in space to a three-dimensional structure.

11. The amplifier circuit of claim 9, wherein the double distributed active transformer is implemented as an integrated circuit.

* * * * *